United States Patent
Cheng et al.

(10) Patent No.: US 7,848,477 B2
(45) Date of Patent: Dec. 7, 2010

(54) SHIFT REGISTERS

(75) Inventors: Kuo-Hsing Cheng, Hsinchu (TW); Wai-Pan Wu, Tainan (TW); Kuo-Hsien Lee, Hsinchu (TW); Chun-Huai Li, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 93 days.

(21) Appl. No.: 12/407,167

(22) Filed: Mar. 19, 2009

(65) Prior Publication Data

US 2010/0172461 A1 Jul. 8, 2010

(30) Foreign Application Priority Data

Mar. 21, 2008 (TW) .............. 97110049 A (51) Int. Cl.
*G11C 19/00* (2006.01)
(52) U.S. Cl. .............. 377/64; 377/68; 377/74; 377/79
(58) Field of Classification Search ............ 377/64, 377/68–79
See application file for complete search history.

(56) References Cited

U.S. PATENT DOCUMENTS

| | | | | |
|---|---|---|---|---|
| 5,517,542 A | * | 5/1996 | Huq | 377/78 |
| 5,859,630 A | * | 1/1999 | Huq | 345/100 |
| 7,310,402 B2 | * | 12/2007 | Wei et al. | 377/64 |
| 7,317,780 B2 | * | 1/2008 | Lin et al. | 377/67 |
| 7,734,003 B2 | * | 6/2010 | Chien et al. | 377/64 |
| 2009/0304138 A1 | * | 12/2009 | Tsai et al. | 377/79 |

* cited by examiner

*Primary Examiner*—Tuan Lam
(74) *Attorney, Agent, or Firm*—Thomas, Kayden, Horstemeyer & Risley (57) ABSTRACT

A shift register including shift register units substantially cascaded is disclosed. Each shift register unit is controlled by first and second clock signals opposite to each other for generating an output signal. Each shift register unit includes first and second switch devices and first and second devices. The first switch device provides the output signal through an output node. The first driving device drives the first switch device according to a first input signal to activate the output signal. The second driving device provides a first voltage signal, according to the first clock signal, to drive the first switch device and de-activate the output signal. When the first switch device de-activates the output signal, the second switch device provides the second voltage signal to the output node according to the second clock signal. A level of the first voltage signal is lower than a level of the second voltage signal.

14 Claims, 6 Drawing Sheets

SHIFT REGISTERS

CROSS REFERENCE TO RELATED APPLICATIONS

This application claims the benefit of Taiwan application Serial No. 97110049 filed Mar. 21, 2008, the subject matter of which is incorporated herein by reference.

BACKGROUND OF THE INVENTION

1. Field of the Invention

The invention relates to a shift register, and more particularly to a shift register unit providing an output signal which is not affected by shifting of threshold voltages of transistors in the shift register unit.

2. Description of the Related Art

In current liquid crystal display panels, gate drivers and drain drivers are arranged to provide scan signals and data signal. In order to decrease cost, a shift register which has the same function as a gate driver is arranged in a glass panel. Most shift registers are formed by amorphous silicon thin-film processes. When a display panel is lit, transistors of a shift register in the display panel are affected by stress, and the display panel thus operates irregularly.

Figure 1:
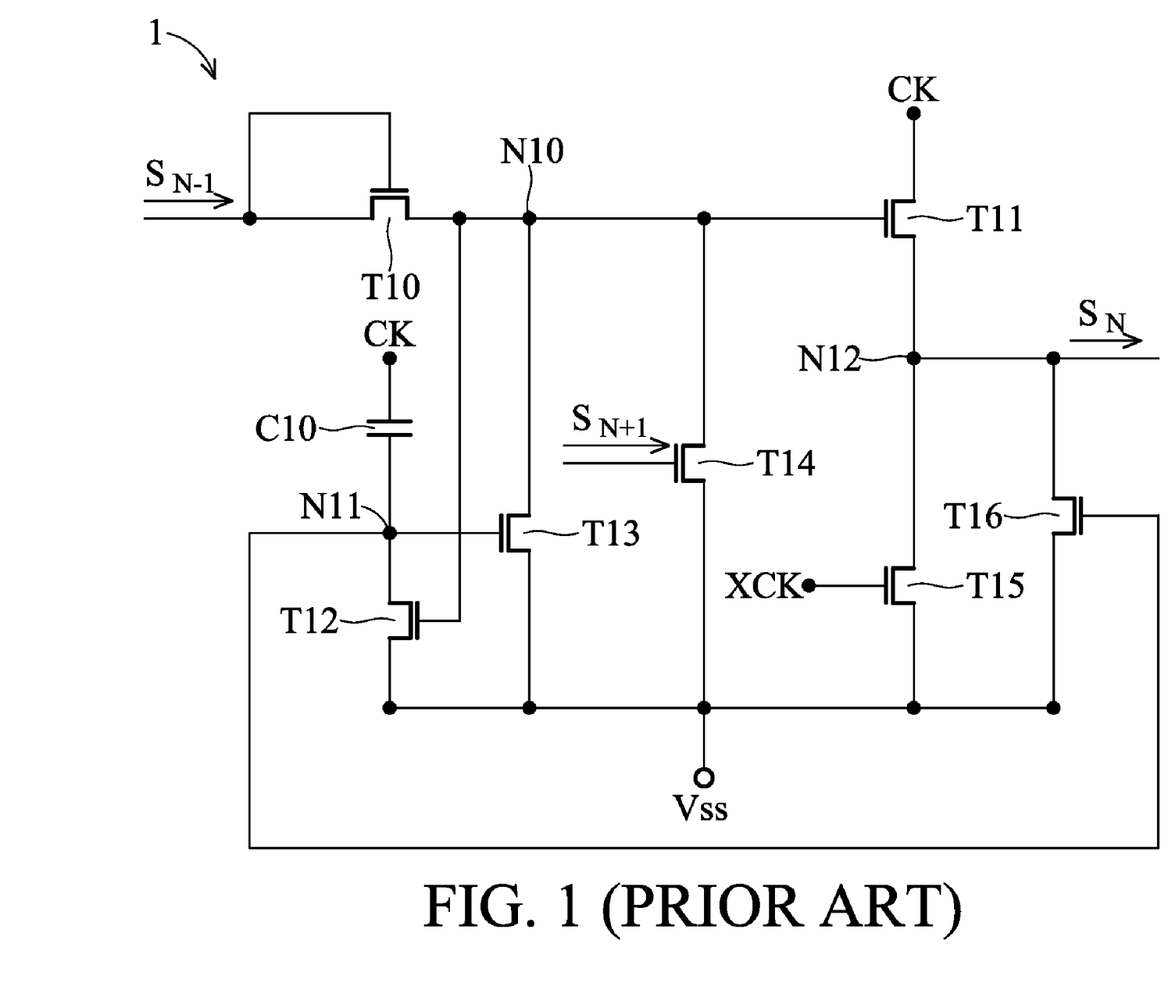
FIG. 1 shows a conventional shift register unit of a shift register.
Figure 2:
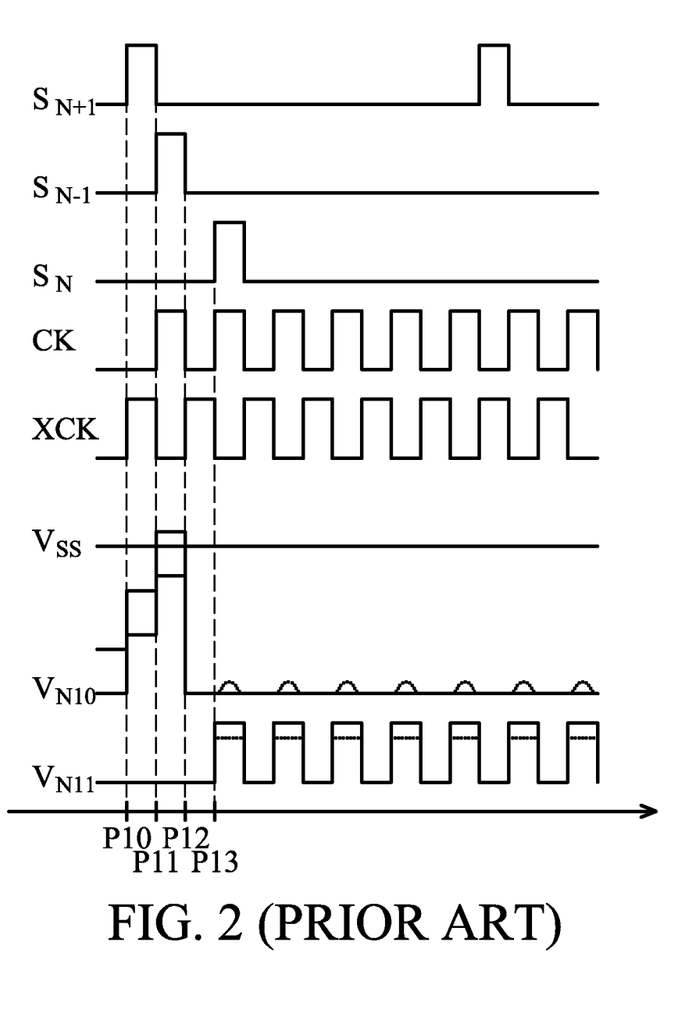
FIG. 2 is a timing chart of signals of the shift register unit in FIG. 1.

FIG. 1 shows a conventional shift register unit of a shift register. FIG. 2 is a timing chart of signals of the shift register unit in FIG. 1. Referring to FIGS. 1 and 2, a shift register unit 1 is controlled by clock signals CK and XCK opposite to each other, that is, the clock signals CK and XCK have inverse phases, and are coupled to a low voltage source Vss. The shift register unit 1 receives output signals $S_{N-1}$ and $S_{N+1}$ respectively from the previous shift register unit and the next shift register unit and generates an output signal $S_N$. At a time point P10, the output signal $S_{N-1}$ is activated, that is, the output signal $S_{N-1}$ is at a high level, and a transistor T10 is turned on. A voltage $V_{N10}$ at a node N10 is changed to a high level according to the output signal $S_{N-1}$ to turn on transistors T11 and T12. At this time, since the clock signal CK is at a low level and the transistor T12 is turned on, a voltage $V_{N11}$ at a node N11 is at a low level to turn off a transistor T13. A transistor T15 is turned on by the clock signal XCK with a high level, and the output signal $S_N$ is de-activated, that is, the output signal $S_N$ is at low level.

At a time point P11, the output signal $S_{N-1}$ is de-activated, and the transistor T10 is turned off. The clock signal CK is changed to a high level. In the period between the time points P11 and P12, the clock signal CK with the high level couples to the node N10 through a capacitor C10 and the transistor T13, so that the voltage $V_{N10}$ at the node N10 is raised to a higher level according to the clock signal CK to turn on the transistors T11 and T12. According to the low voltage source Vss and the turned-on transistor T12, the voltage $V_{N11}$ at the node N11 remains at the low level to turn off the transistor T13. The clock signal CK with the high level is transmitted to an output node N12 through the turned-on transistor T11 to serve as the output signal $S_N$, in other words, the output signal $S_N$ is activated. The clock signal XCK with a low level turns off a transistor T15, and the voltage $V_{N11}$ with the low level turns off a transistor T16. Accordingly, the output signal $S_N$ can stably remain in the activated state.

At a time point P12, the clock signal CK is changed to a low level, and the output signal $S_{N+1}$ is activated to turn on the transistor T14. The voltage $V_{N10}$ at the node N10 is gradually decreased according to the low voltage source Vss to turn off the transistors T11 and T12. At this time, the clock signal XCK with a high level turns on the transistor T15, so that the voltage of the low voltage source Vss is provided to the output node N12 to serve as the output signal $S_N$, in other words, the output signal $S_N$ is de-activated.

At a time point P13, the clock signal CK is changed to a high level, and the voltage $V_{N11}$ at the node N11 is changed to a high level to turn on the transistor T13. Thus, the voltage N10 remains at a low level. Moreover, the voltage $V_{N11}$ with the high level turns on the transistor T16, so that the output signal $S_N$ remains in the de-activated state. After the time point P13, the shift register unit 1 operates according to the clock signal CK and XCK. The voltage $V_{N10}$ at the node N11 is switched between a high level and a low level.

It is assumed that the high level and the low level of the clock signal CK is 15V and −9V respectively, and the voltage of the low voltage source Vss is −7V. When the clock signal CK is at the high level to turn on the transistor T13, the voltage difference between a gate and a source of the transistor T13 is 22V. If the gate-source voltage Vgs of the transistor T13 is in the positive base stress for a long period of time, the threshold voltage of the transistor T13 shifts, and the voltages $V_{N10}$ and $V_{N11}$ are irregular, as shown by the dot line in $V_{N10}$ and $V_{N11}$ in FIG. 2. Thus, when the threshold voltages of the transistors in the shift register unit 1 shift, the shift register unit 1 operates irregularly and outputs an incorrect output signal $S_N$.

BRIEF SUMMARY OF THE INVENTION

An exemplary embodiment of a shift register comprises a plurality of shift register units substantially cascaded. Each of the shift register units is controlled by a first clock signal and a second clock signal opposite to each other for generating an output signal. The output signal is activated periodically. Each of the shift register units comprises first and second switch devices and first and second driving devices.

The first switch device provides the output signal through an output node. The first driving device drives the first switch device according to a first input signal to activate the output signal. The second driving device is coupled to a first voltage signal and provides the first voltage signal according to the first clock signal to drive the first switch device to de-activate the output signal. The second switch device is coupled to a second voltage signal. When the first switch device de-activates the output signal, the second switch device provides the second voltage signal to the output node according to the second clock signal. A level of the first voltage signal is lower than a level of the second voltage signal.

Another exemplary embodiment of a shift register comprises first, second, and third shift register units substantially cascaded. Each of the first, second, and third shift register unit is controlled by a first clock signal and a second clock signal opposite to each other for generating an output signal. The output signal is activated periodically. Each of the first, second, and third shift register units comprises first and second switch devices and first and second driving devices.

The first switch device provides the output signal through an output node. The first driving device drives the first switch device according to a first input signal to activate the output signal. The second driving device is coupled to a first voltage signal and provides the first voltage signal according to the first clock signal to drive the first switch device to de-activate the output signal. The second switch device is coupled to a second voltage signal. When the first switch device de-activates the output signal, the second switch device provides the second voltage signal to the output node according to the second clock signal. A level of the first voltage signal is lower than a level of the second voltage signal. The output signal of the first shift register unit serves as the first input signal of the second shift register unit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Shift registers are provided. In an exemplary embodiment of a shift register in FIG. 3, a shift register 3 comprises a plurality of shift register units $30_1$-$30_M$ substantially cascaded. Each of the shift register units $30_1$-$30_M$ is controlled by clock signals CK and XCK and coupled to a voltage source. The clock signals CK and XCK are opposite to each other, that is, the clock signals CK and XCK have inverse phases. Each of the shift register units $30_1$-$30_M$ receives a first input signal and a second input signal and generates an output signal according to the clock signals CK and XCK. Output signals $S_1$-$S_M$ generated by the shift register are activated substantially, and each of the output signals $S_1$-$S_M$ is activated periodically.

Figure 3:
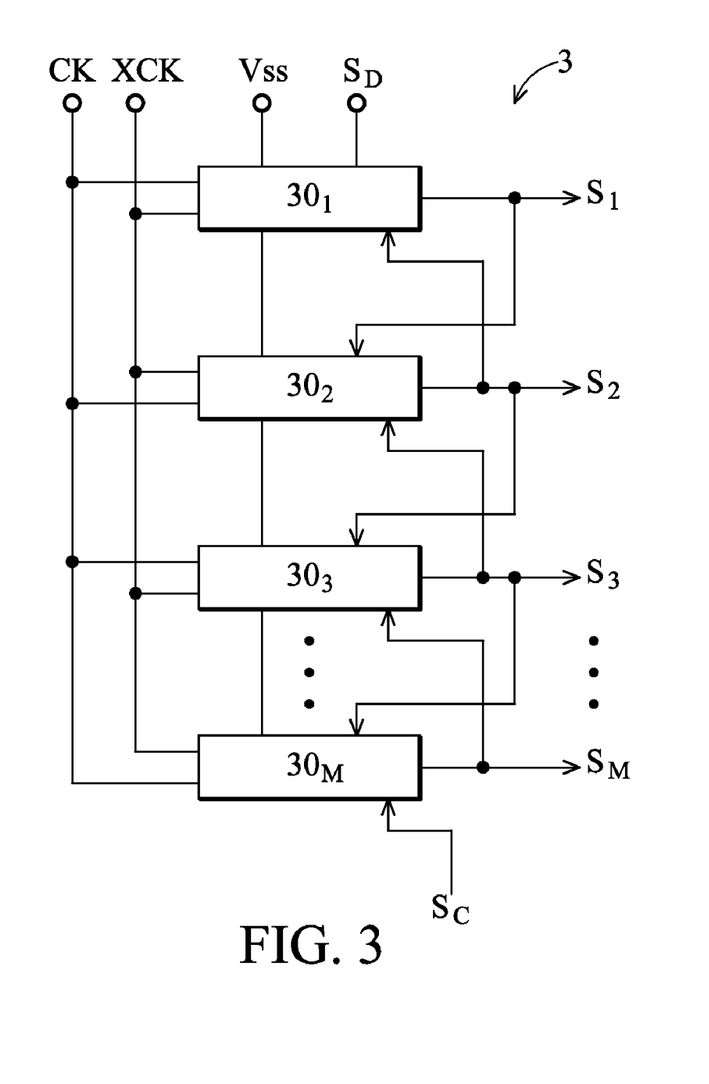
FIG. 3 shows an exemplary embodiment of a shift register.

Each ($30_N$) of the shift register units $30_1$-$30_M$ receives an output signal $S_{N-1}$ generated by the previous shift register units $30_{N-1}$ to serve as the first input signal and an output signal $S_{N+1}$ generated by the next shift register units $30_{N+1}$ to serve as the second input signal, wherein 1<N<M, and N is an integer. The output signals $S_{N-1}$, $S_N$, and $S_{N+1}$ are activated substantially. For example, the shift register units $30_2$ receives the output signal $S_1$ generated by the previous shift register units $30_1$ and the output signal $S_3$ generated by the next shift register units $30_3$ and generates the output signal $S_2$. The output signal $S_2$ generated by the shift register units $30_2$ is received by the next shift register units $30_3$.

The shift register units $30_1$, which is the first stage of the shift register 3, receives the output signal $S_2$ from the shift register units $30_2$ to serve as the second input signal. The shift register units $30_1$ further receives a driving signal $S_D$ generated by an external or internal circuit to serve as the first input signal. The driving signal $S_D$, the output signal $S_1$, and the output signal $S_2$ are activated substantially. Similarly, the shift register units $30_M$, which is the last stage of the shift register 3, receives the output signal $S_{M-1}$ from the shift register units $30_{M-1}$ to serve as the first input signal. The shift register units $30_{M-1}$ further receives a control signal $S_C$ generated by an external or internal circuit to serve as the second input signal. The output signal $S_{M-1}$, the output signal $S_M$, and the control signal $S_C$ are activated substantially.

Figure 4:
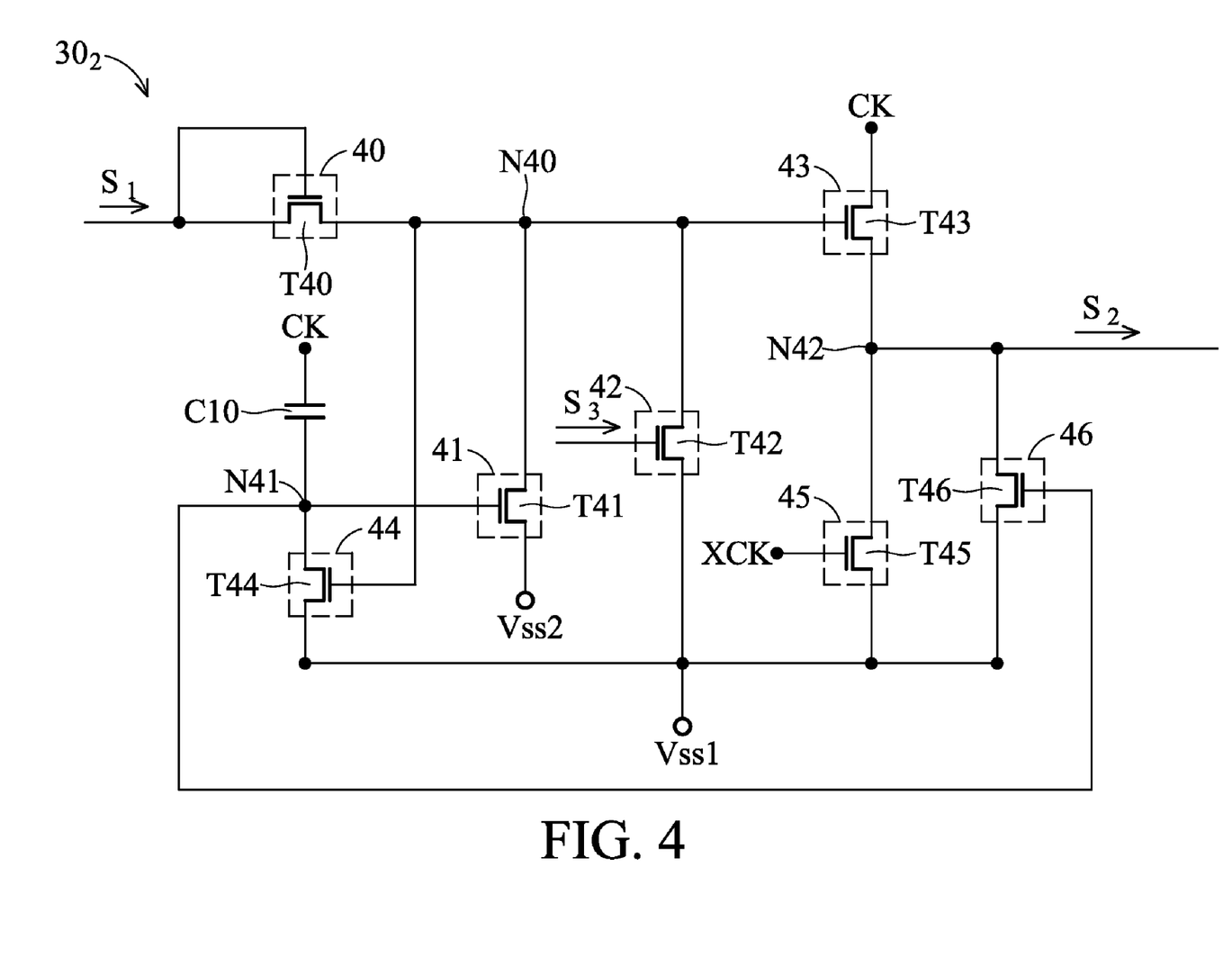
FIG. 4 shows an exemplary embodiment of a shift register unit.

FIG. 4 shows an exemplary embodiment of a shift register unit. In the embodiment in FIG. 4, the shift register unit $30_2$ of the shift register 3 is given as an example for description, and the other shift register units $30_1$ and $30_3$-$30_M$ have the same circuitry as the shift register units $30_2$. The shift register units $30_2$ receives the output signal $S_1$ generated by the previous shift register units $30_1$ to serve as the first input signal and the output signal $S_3$ generated by the next shift register units $30_3$ to serve as the second input signal.

Figure 5:
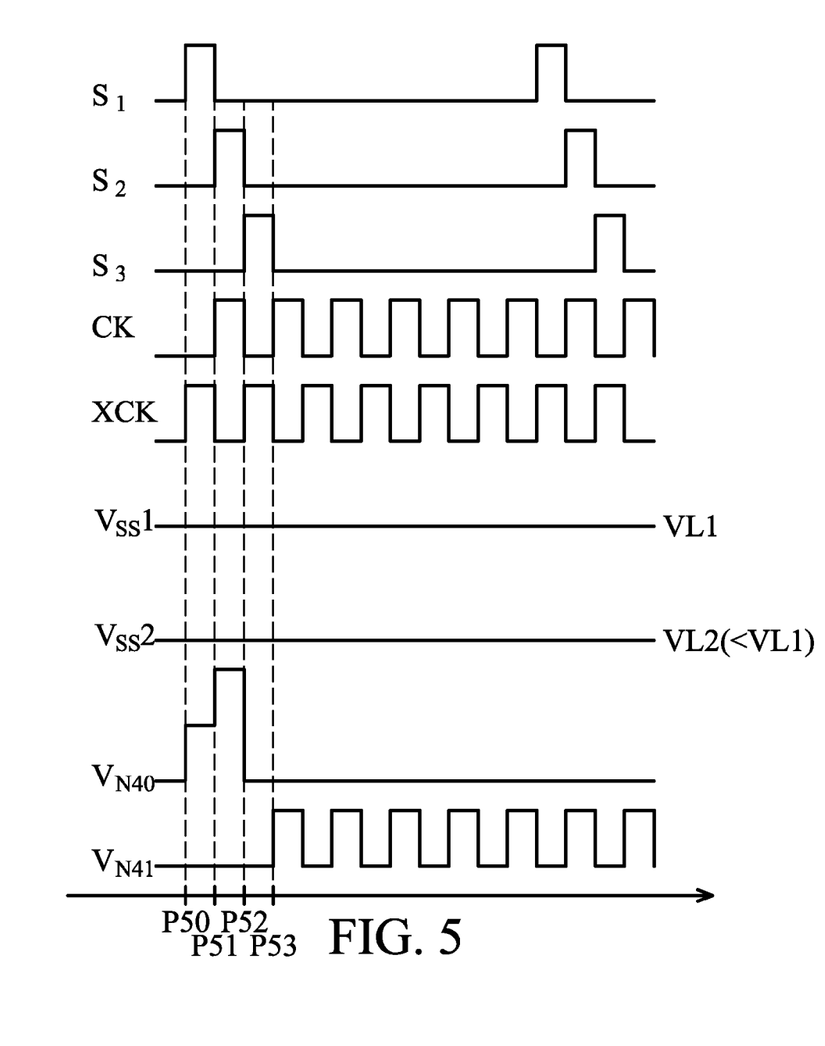
FIG. 5 is a timing chart of signals of the shift register unit in FIG. 4.

The shift register unit $30_2$ comprises driving devices 40-42, switch devices 43-46, and a capacitor C40. In the embodiment, the driving devices 40-42 and the switch devices 43-46 are implemented respectively by NMOS transistors T40-T42 and T43-T46. Sources of the transistors T42 and T44-T46 are coupled to a voltage source Vss1, and a source of the transistor T41 is coupled to a voltage source Vss2. A level (VL2) of a voltage signal provided by the voltage source Vss2 is lower than a level (VL1) of a voltage signal provided by the voltage source Vss1. In the following description, a state of a signal being at a high level indicates the signal is activated, while a state of a signal being at a low level indicates the signal is de-activated. FIG. 5 is a timing chart of signals of the shift register unit in FIG. 4. The detailed operation of the shift register unit $30_2$ is described in the following.

At a time point P50, the output signal $S_1$ is changed to a high level, and a transistor T40 is turned on. A voltage $V_{N40}$ at a node N40 is changed to a high level according to the output signal $S_1$ to turn on transistors T43 and T44. At this time, since the clock signal CK is at a low level and the transistor T44 is turned on, a voltage $V_{N41}$ at a node N41 is at the low level to turn off a transistor T41. A transistor T45 is turned on by the clock signal XCK with a high level, so that the output signal $S_2$ is at a low level, that is the output signal $S_2$ is de-activated.

At a time point P51, the output signal $S_1$ is changed to a low level, and the transistor T40 is turned off. The clock signal CK is changed to a high level. In the period between the time points P51 and P52, the clock signal CK with the high level couples to the node N40 through a capacitor C40 and the transistor T41, so that the voltage $V_{N40}$ at the node N40 is raised to a higher level according to the clock signal CK to turn on the transistors T43 and T44. A low-level voltage signal provided by the voltage source Vss1 is transmitted to the node N41 to turn off the transistor T41, that is the transistor T41 is disabled. The clock signal CK with the high level is transmitted to an output node N42 through the turned-on transistor T43 to serve as the output signal $S_2$, in other words, the output signal $S_1$ is activated. The low-level voltage signal provided by the voltage source Vss1 is transmitted to the node N41, and voltage $V_{N41}$ remains at the low level to turn off the transistor T46. The clock signal XCK with a low level turns off the transistor T45. Accordingly, the output signal $S_1$ can stably remain in the activated state.

At a time point P52, the clock signal CK is changed to a low level, and the output signal $S_3$ is activated to turn on the transistor T42. The voltage $V_{N40}$ at the node N40 is gradually decreased according to the low-level voltage signal of the voltage source Vss1 to turn off the transistors T43 and T44, so that the transistor T43 does not activate the output signal $S_2$. At this time, the clock signal XCK with a high level turns on the transistor T45, so that the low-level voltage signal of the voltage source Vss1 is provided to the output node N42 to serve as the output signal $S_2$, in other words, the output signal $S_2$ is de-activated.

At a time point P53, the clock signal CK is changed to a high level, and the voltage $V_{N41}$ at the node N41 is changed to a high level to turn on the transistor T41. The low-level voltage signal of the voltage source Vss2 is coupled to the node N40 through the turned-on transistor T41. Thus, the voltage $V_{N40}$ at the node N40 remains at a low level to turn off the transistor T43, so that the transistor T43 does not activate the output signal $S_2$. Moreover, the voltage $V_{N41}$ with the high level turns on the transistor T46, and the low-level voltage signal of the voltage source Vss1 is provided to the output node N42 to serve as the output signal $S_2$. Thus, the output signal $S_2$ remains in the de-activated state. After the time point P53, the shift register unit $30_2$ operates according to the clock signal CK and XCK. The voltage $V_{N41}$ at the node N41 is switched between a high level and a low level.

Figure 6:
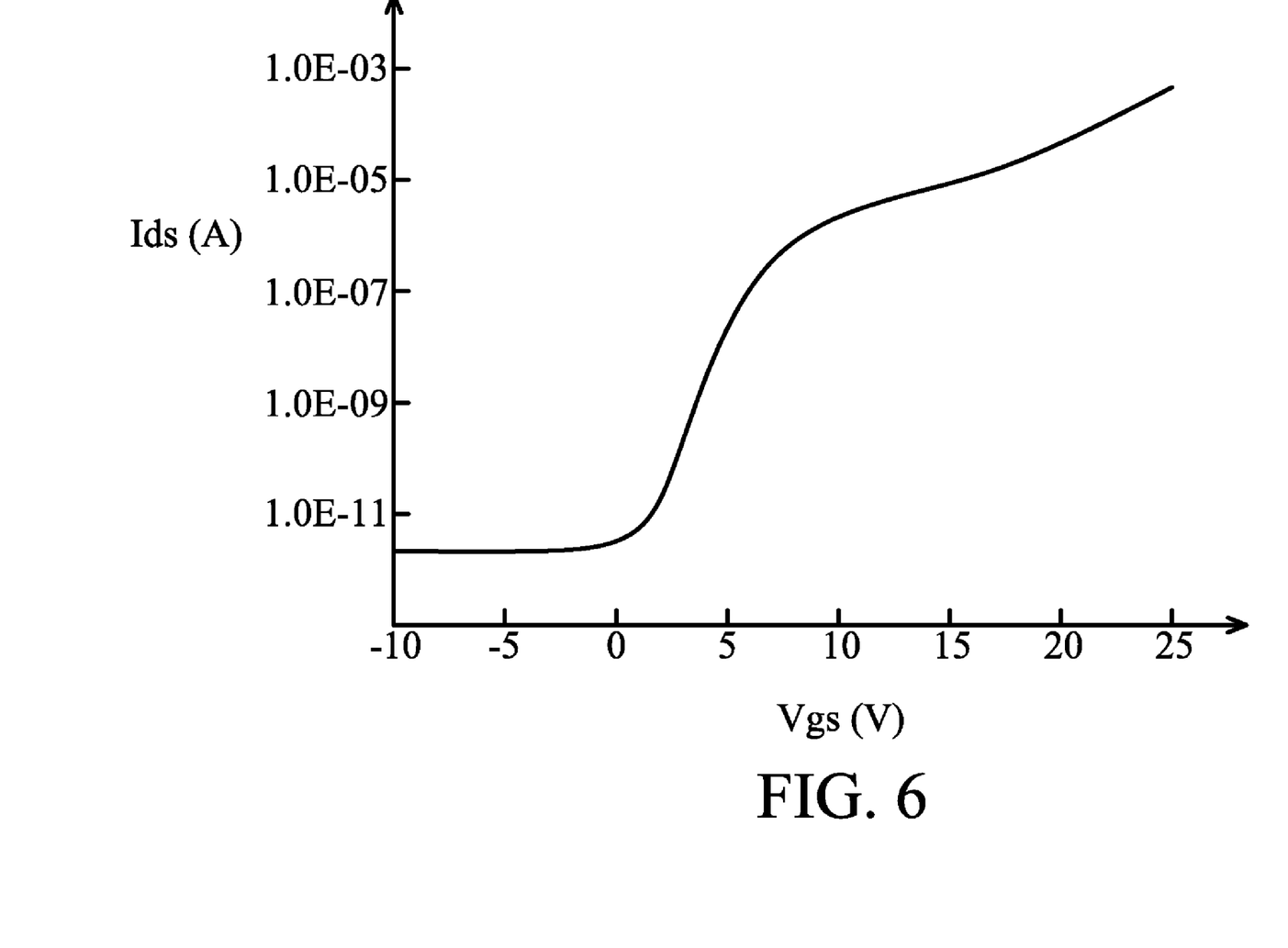
FIG. 6 shows element characteristic of the transistor T13 in FIG. 1 and the transistor T41 in FIG. 4 when they operate for a period of time.

It is assumed that the high level and the low level of the clock signal CK is 15V and −9V respectively, the voltage signal of the voltage source Vss1 is −7V, and the voltage signal of the voltage source Vss2 is −10V. When the clock signal CK is at a high level to turn on the transistor T41, the voltage difference between a gate and a source of the transistor T41 is 25V. The gate-source voltage Vgs of the transistor T41 is in the large positive base stress. Compared with the transistor T13 in FIG. 1, since the gate-source voltage Vgs of the transistor T41 is in a larger positive base stress than that of the gate-source voltage Vgs of the transistor T13 (25V>22V), a drain-source current Ids generated by the transistor T41 is larger than that of a drain-source current Ids generated by the transistor T13. FIG. 6 shows element characteristic of the transistor T13 in FIG. 1 and the transistor T41 in FIG. 4 when they operate for a period of time. Referring to FIG. 6, the drain-source current Ids corresponding to the 25V gate-source voltage Vgs is larger than the drain-source current Ids corresponding to the 22V gate-source voltage Vgs. If the positive gate stress induces the threshold voltage of the transistor T41 shifting, the shift register unit $30_2$ can operate regularly because the transistor T41 generates a larger drain-source current Ids.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register, comprising:
    a plurality of shift register units substantially cascaded, each controlled by a first clock signal and a second clock signal opposite to each other for generating an output signal, wherein the output signal is activated periodically, and each of the shift register units comprises:
        a first switch device for providing the output signal through an output node;
        a first driving device for driving the first switch device according to a first input signal to activate the output signal;
        a second driving device, coupled to a first voltage signal, for providing the first voltage signal, according to the first clock signal, to drive the first switch device and de-activate the output signal; and
        a second switch device, coupled to a second voltage signal, for providing the second voltage signal to the output node, according to the second clock signal, when the first switch device de-activates the output signal, wherein a level of the first voltage signal is lower than a level of the second voltage signal.

2. The shift register as claimed in claim 1, wherein each of the shift register units further comprises a third diving device, coupled to the second voltage signal, for driving the first switch device to de-activate the output signal by the second voltage signal according to a second input signal, and
    wherein each of the first and second input signals is activated periodically, and the first input signal, the output signal, and the second input signal are activated substantially.

3. The shift register as claimed in claim 2, wherein the plurality of shift register units comprises first, second, and third shift register units substantially cascaded, the output signal of the first shift register unit serves as the first input signal of the second shift register unit, the output signal of the second shift register unit serves as the first input signal of the third shift register unit and the second input signal of the first shift register, and the output signal of the third shift register unit serves as the second input signal of the second shift register unit.

4. The shift register as claimed in claim 1, wherein each of the shift register units further comprises a third switch device, coupled to the second voltage signal, for providing the second voltage signal to the output node according to the first clock signal when the first switch device de-activates the output signal.

5. The shift register as claimed in claim 1, wherein each of the shift register units further comprises a fourth switch device, coupled to the second voltage signal, for disabling the second driving device by the second voltage signal when the first driving device drives the first switch device to activate the output signal.

6. The shift register as claimed in claim 1, wherein the plurality of shift register units comprises first, second, and third shift register units substantially cascaded, the output signal of the first shift register unit serves as the first input signal of the second shift register unit, the output signal of the second shift register unit.

7. A shift register, comprising:
    first, second, and third shift register units substantially cascaded, each controlled by a first clock signal and a second clock signal opposite to each other for generating an output signal, wherein the output signal is activated periodically, and each of the first, second, and third shift register units comprises:
        a first switch device for providing the output signal through an output node;
        a first driving device for driving the first switch device according to a first input signal to activate the output signal;
        a second driving device, coupled to a first voltage signal, for providing the first voltage signal, according to the first clock signal, to drive the first switch device and de-activate the output signal; and
        a second switch device, coupled to a second voltage signal, for providing the second voltage signal to the output node, according to the second clock signal, when the first switch device de-activates the output signal, wherein a level of the first voltage signal is lower than a level of the second voltage signal;
    wherein the output signal of the first shift register unit serves as the first input signal of the second shift register unit.

8. The shift register as claimed in claim 7,
wherein each of the first, second, and third shift register units further comprises a third diving device, coupled to the second voltage signal, for driving the first switch device to de-activate the output signal by the second voltage signal according to a second input signal, and
wherein the output signal of the third shift register unit serves as the second input signal of the second shift register unit, and the output signals of the first, second, and third shift register units are activated substantially.

9. The shift register as claimed in claim 8, wherein the output signal of the second shift register unit serves the second input signal of the first shift register unit.

10. The shift register as claimed in claim 7, wherein each of the first, second, and third shift register units further comprises a third switch device, coupled to the second voltage signal, for providing the second voltage signal to the output node according to the first clock signal when the first switch device de-activates the output signal.

11. The shift register as claimed in claim 7, wherein each of the first, second, and third shift register units further comprises a fourth switch device, coupled to the second voltage signal, for disabling the second driving device by the second voltage signal when the first driving device drives the first switch device to activate the output signal.

12. The shift register as claimed in claim 7, wherein the output signal of the second shift register unit serves the first input signal of the third shift register unit.

13. The shift register as claimed in claim 12, wherein the output signals of the first, second, and third shift register units are activated substantially.

14. The shift register as claimed in claim 1, wherein for each of the first, second, and third shift register units, the first input signal and the output signal are activated substantially.

* * * * *